United States Patent [19]

Aitken

[11] Patent Number: 5,124,557

[45] Date of Patent: Jun. 23, 1992

[54] APPARATUS AND METHODS RELATING TO ION IMPLANTATION AND HEAT TRANSFER

[75] Inventor: Derek Aitken, Surbiton, England

[73] Assignee: Superion Limited, Surbiton, England

[21] Appl. No.: 592,374

[22] Filed: Oct. 3, 1990

[30] Foreign Application Priority Data

Oct. 3, 1989 [GB] United Kingdom ............... 8922225

[51] Int. Cl.$^5$ ................... G01N 21/02; G21K 5/10; H01J 37/30

[52] U.S. Cl. .................. 250/442.11; 250/443.1; 250/492.2

[58] Field of Search ............ 250/443.1, 442.1, 492.21, 250/358

[56] References Cited

U.S. PATENT DOCUMENTS

| | | | |
|---|---|---|---|
| 4,483,654 | 11/1984 | Koch et al. | 250/442.1 |
| 4,578,589 | 3/1986 | Aitken | 250/492.21 |
| 4,682,566 | 7/1987 | Aitken | 250/492.21 |
| 4,733,091 | 3/1988 | Robinson et al. | 250/443.1 |
| 4,745,287 | 5/1988 | Turner | 250/442.1 |
| 4,831,270 | 5/1989 | Weisenburger | 250/492.21 |
| 4,965,862 | 10/1990 | Freztsis et al. | 250/492.21 |
| 5,030,835 | 7/1991 | Tamcin et al. | 250/492.2 |

OTHER PUBLICATIONS

D. Aitken, "The Design Philosophy For A 200 kV Industrial High Current Ion Implanter", Nuclear Instruments and Methods 139 (1976) 125-134.

H. M. B. Bird, et al., "PR-200 Ion Implantation System"; J. Vac. Sci. Technol., vol. 15, No. 3, May/Jun. 1978, pp. 1080-1085.

Primary Examiner—Bruce C. Anderson
Attorney, Agent, or Firm—Cushman, Darby & Cushman

[57] ABSTRACT

Apparatus for presenting target elements (16) such as semi-conductor wafers to an ion beam (13) for ion implantation comprises a support rotor (19) for carrying the targets (16) on support bases (21) mounted on arms (22) extending radially from a core structure (20) of the rotor. The target elements (16) are rotated by the rotor (19) through the ion beam to produce scanning across the target elements. Each support base (21) is rotatable about the radial axis of its support arm. The rotation of the base (21) allows adjustment of the ion implantation angle. The implantation normally takes place with the target vertical and the axis of scanning rotation horizontal. Each support base (21) is also rotatable through 90° to allow loading and unloading of target elements while the support base is horizontal. Good thermal contact is made between the target element and the support base by an intervening sheet having upstanding flaps (61) which are urged outwardly into contact with the element (16) by the effect of centrifugal force.

26 Claims, 7 Drawing Sheets

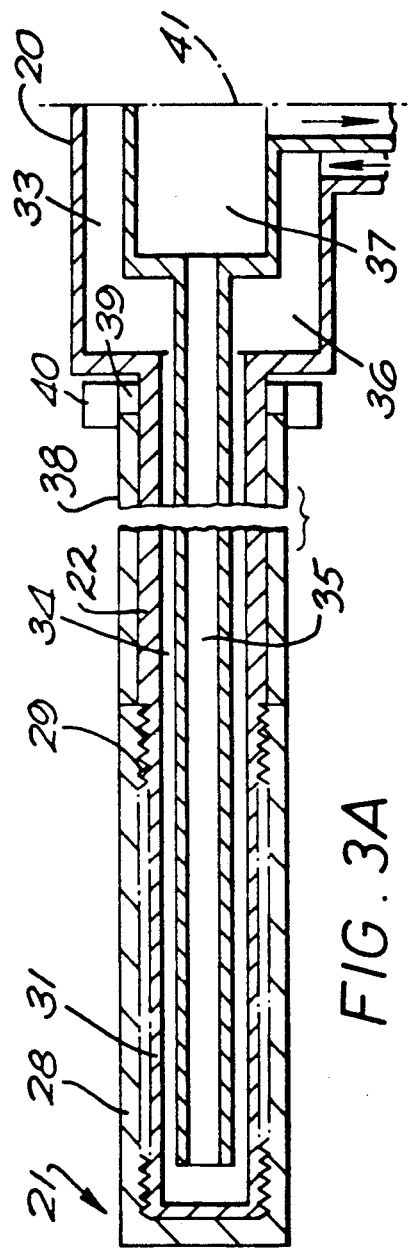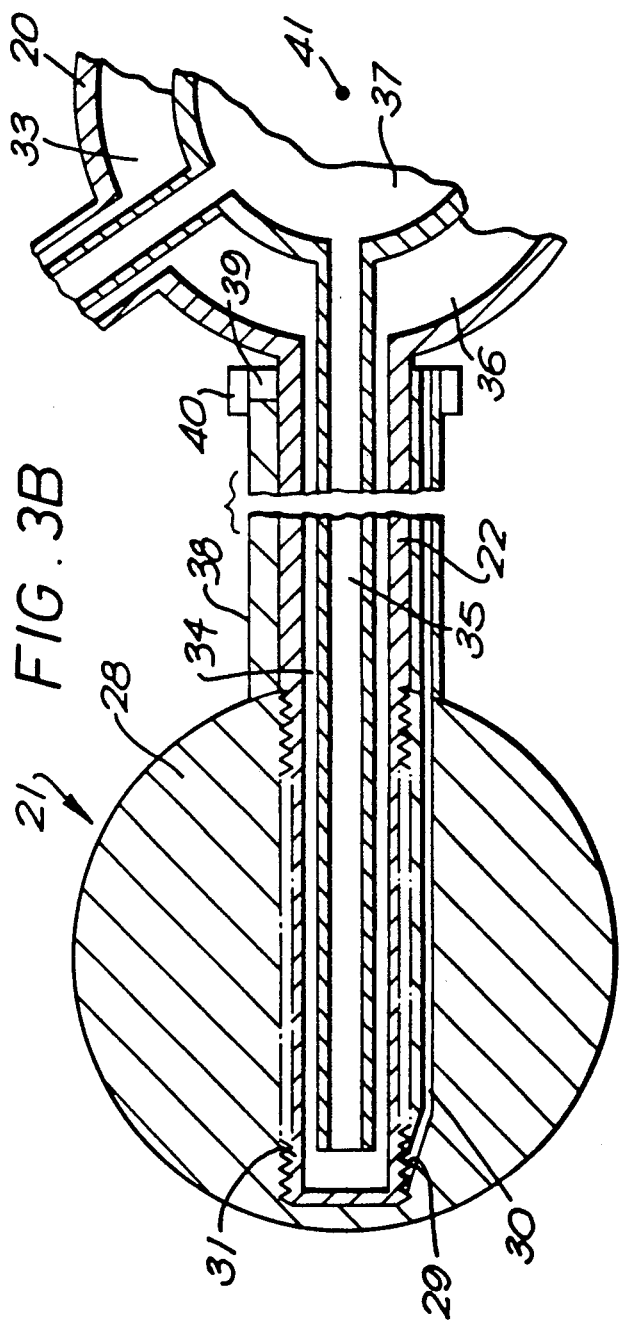

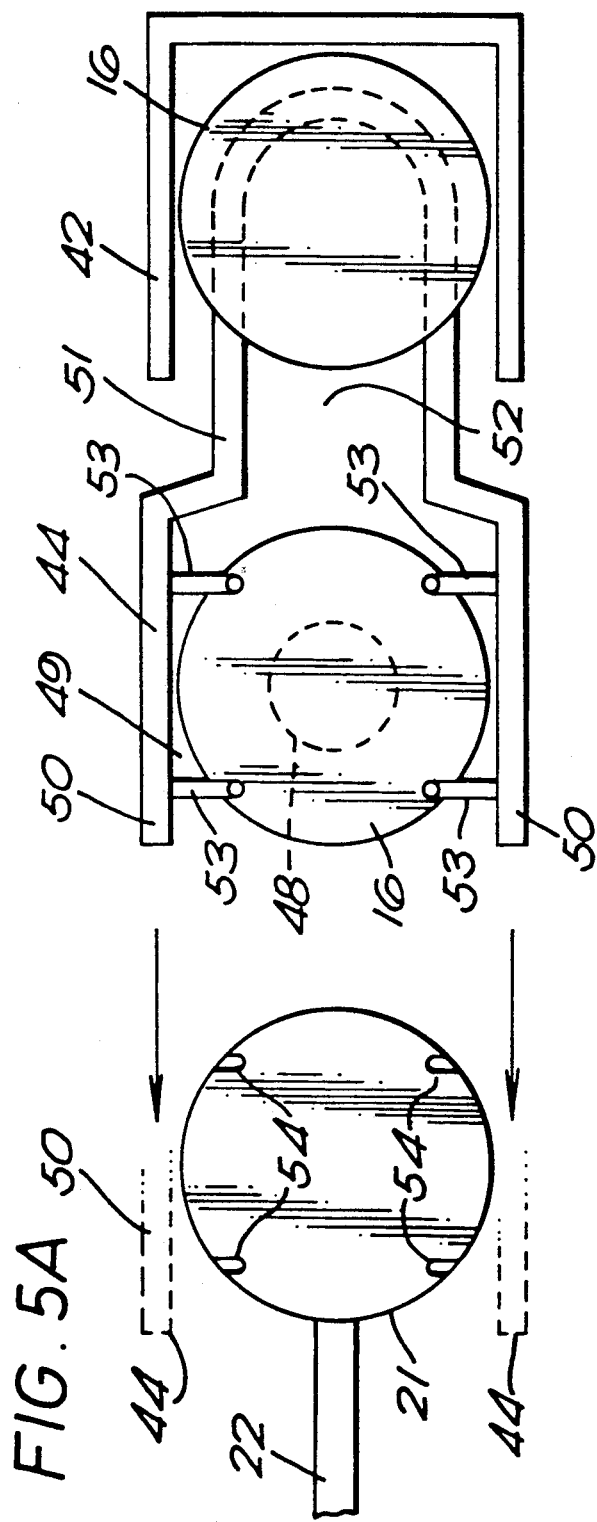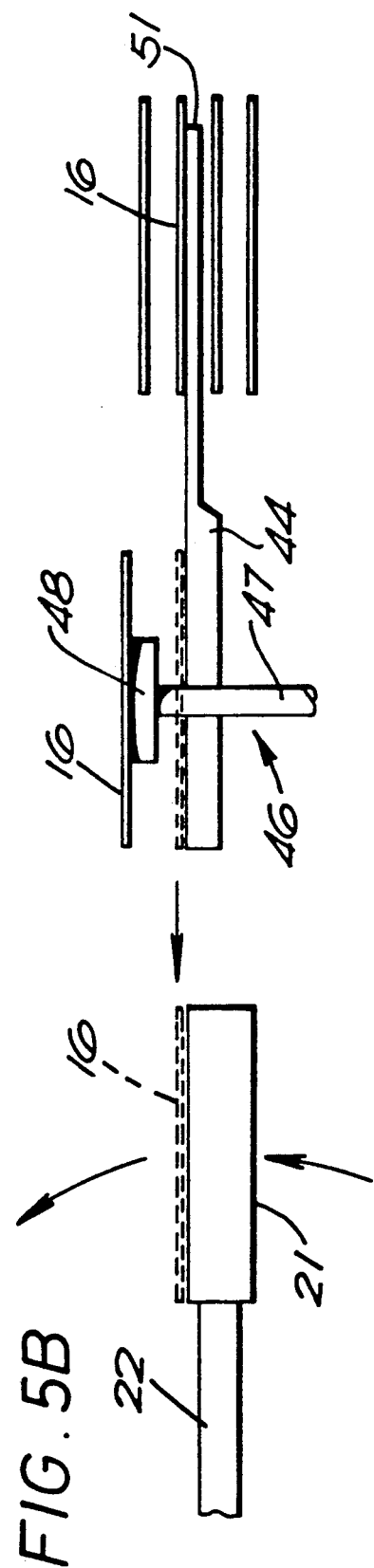

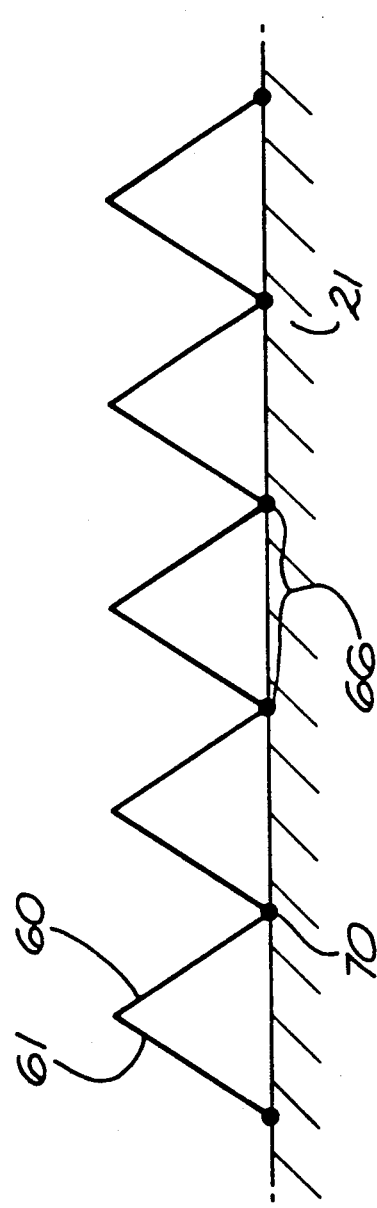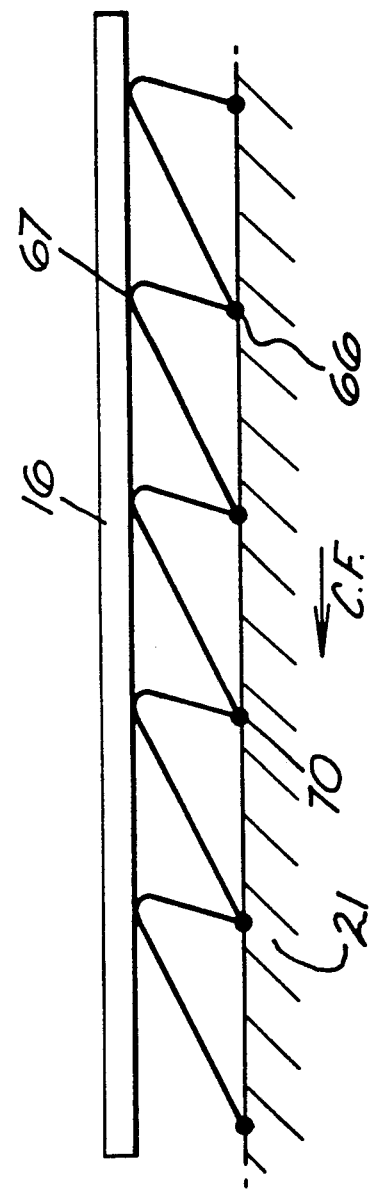

APPARATUS AND METHODS RELATING TO ION IMPLANTATION AND HEAT TRANSFER

The present invention is concerned with apparatus and methods relating to ion implantation and/or to heat transfer. In one aspect the present invention relates to apparatus for and a method of presenting target elements to an ion beam for ion implantation, and also relates to an overall apparatus for and method of implanting ions in a target element. In another aspect the invention also relates, independently, to an improved heat sink, and, to a device for providing thermal contact between bodies, particularly in vacuum.

In all aspects the invention relates in particular but not exclusively, to apparatus for and methods of implanting ions of a preselected species, into a target element, for example the controlled introduction of a species into the surface layer of another material. The technique is important in semi-conductor technology where it is used in the manufacture of integrated circuits and other devices, particularly by modifying the conductivity of semi-conductor material by introducing chemical impurities into the material. The general background to the use of ion implantation in the manufacture of large scale integrated circuit chips is set out in published U.S. Pat. No. 4,578,589, having the same inventor as the present application.

An ion implantation apparatus normally consists of an ion source, an extraction system having an extraction electrode which accelerates the ions from the extraction slot in the ion source, an analysing magnet for the selection of the required ion species, acceleration stages before or after the analysing magnet, and a target region with means for producing relative scanning movement between the beam and the target, either by scanning the beam, or by moving the target.

In high current ion implanters, beam scanning (that is to say electrostatic or magnetic movement of the beam) is not in general a viable technique for uniformly implanting silicon wafers, or other targets. Consequently, mechanical scanning of the target through the beam is normally the preferred technique. A number of different types of scanning are used, for example techniques which are known as linear mechanical scan, cylindrical carousel, Ferris wheel, racetrack carousel, and spinning disc. All these techniques have various drawbacks. The linear mechanical scan technique is slow. The cylindrical carousel and Ferris wheel have cosine scanning errors. The cylindrical carousel has an implant angle error. The linear mechanical scan, Ferris wheel and racetrack carousel systems all present difficulties in introducing coolant into the system.

In general, the so-called spinning disc system represents the most suitable system for most semi-conductor requirements. The spinning disc has the advantages of a high scanning speed (by simple rotation, with no discontinuities in the motion), easy introduction of coolant (through a hollow central shaft), and in principle the system has no geometric scanning errors. In practice however problems do arise with scanning errors. Due to heating during ion implantation, it is necessary to provide good contact between a target element and a heat sink on which it is supported, and this is commonly provided by inclining the target element to a radial plane of the spinning disc, so that the target element is forced against an inclined heat sink surface, by effect of centrifugal force. This technique is known as centrifugal clamping of the target element, or wafer, against the heat sink, which commonly has an elastomer coating on its surface. Another factor is that there is increasingly a requirement for the ability to vary the implant angle. The requirements for variable implant angle and centrifugal clamping, result in many systems using spinning disc scanning with the ion beam direction arranged at an angle to the spin axis of the disc. This causes an implant angle error, in excess of two degrees under certain conditions. This may lead to channelling inconsistencies during implantation across the wafer, and can make the arrangement unacceptable.

Developments in semi-conductor technology have given rise to increasing demands upon ion implantation techniques. There is an increasing need for parallel scanning, where the implant angle is constant in magnitude and direction on the entire target surface. There is also an increasing requirement for different implant angles to be achieved and for a wider range of angles to be required. On occasions there may be a requirement to change the implant angle during implant. A number of implants may be required into the same wafer with different wafer orientations, for example for the implant of trench side walls.

It is one object of the present invention to provide ion implantation apparatus which allows presentation of a set of target elements generally in a plane perpendicular to the axis of rotation of the element during scanning, while providing adequate thermal contact with a heat sink. Another object is to allow variation of implant angle selectively without introducing scanning errors.

Another requirement for an ion implanter in modern semi-conductor technology is for efficient, fast, automatic loading (preferably in vacuum), with no particulate generation.

It is generally regarded that the preferred orientation of the target wafer during implantation is vertical or near vertical, for reasons of cleanliness. However it is easier to handle the target wafers during loading and unloading, in a horizonal or near horizonal orientation. This is probably also cleaner, because of the absence of wafer edge contact.

It is another object of the present invention, at least in preferred embodiments, to provide an improved mechanism for loading and/or unloading target elements in an ion implantation apparatus.

A final aspect of the invention is concerned with heat transfer. During implantation each wafer is mounted on a heat sink to disperse heat from the ion implantation. It is an object of the present invention, at least in preferred embodiments, to provide an improved heat sink which avoids distortion or stress on a target wafer, which reduces the creation of particulates by wafer edge contact during loading and unloading, and allows a cooling system which is compatible with change of implant angle through substantial angles, without introducing scan angle errors caused by inclining the spin axis to the beam direction.

The various aspects of the invention will now be dealt with by setting out features of the invention in a number of independent aspects.

According to the present invention in a first aspect there is provided apparatus for presenting target elements to an ion beam for ion implantation comprising a support rotor having a plurality of support bases for supporting target elements, the support bases being mounted on and distributed around the support rotor, means for rotating the support rotor so as to carry the bases through a target region to produce in operation scanning of an ion beam across the bases, and means for rotating each support base about an axis which is transverse to the axis of rotation of the rotor.

The invention has particular application to apparatus for implanting ions in a target element. Such apparatus in accordance with the invention comprises, as a component assembly, a target presentation apparatus as set out in the previous paragraph, or as set out in succeeding paragraphs, together with means for producing an ion beam, and means for accelerating, analysing and focusing the ion beam, and directing the beam onto the target element.

Although the transverse axis of rotation of the support base may be inclined to a plane perpendicular to the axis of rotation of the rotor, and indeed in some cases may be spaced from the axis of rotation of the rotor (i.e. at a skew angle), it is much preferred that the transverse axis of rotation of the support base passes through the axis of rotation of the rotor, most preferably being radial or substantially radial to the axis of rotation of the rotor.

By way of example the transverse axis of rotation of the support base could be inclined to a plane perpendicular to the axis of rotation of the rotor, at an angle of 25 plus or minus 7°.

In accordance with one preferred feature, the means for rotating the support base is arranged to provide a fine adjustment of the angle of the base relative to a plane perpendicular to the axis of rotation of the rotor, for adjusting the implant angle during ion implantation. The feature allows zero implant angle scanning with the target elements in an advantageous orientation perpendicular to the axis of rotation (preferably in a vertical or near vertical plane), together with selected variation of the implant angle without introducing implant angle errors.

Preferably during ion implantation the ion beam is arranged parallel to or substantially parallel to the axis of rotation of the rotor, but in some cases the ion beam may be inclined to the axis of rotation at a substantial selected angle, for example up to plus or minus 30°, when parallel scanning is not an issue.

In accordance with another preferred feature of the invention, the means for rotating the support base is arranged to provide for rotation of the base through at least plus or minus 90°, to allow the base to be bought to an orientation such as to lie in a plane containing the axis of rotation of the rotor, or approximately in such a plane, for loading and unloading of target elements to and from the support base. This feature is advantageous in allowing the support base to be rendered horizontal, or approximately horizonal, during loading and unloading of target elements to and from the support base.

Considering now a preferred structure for the support rotor, it is preferred that the support rotor includes a central core structure and a plurality of support arms each extending outwardly from the core structure each support base being mounted on a support arm. Preferably each base is formed as a heat sink for a target element during ion implantation, the arms each having passageways for supplying coolant to, and for withdrawing coolant from, the region of the bases. Preferably there is provided means such as a gear drive for rotating each base relative to the arm on which it is mounted.

In one preferred form, the junction between each base and its support arm is provided with a high conductivity, deformable medium, and the junction is so shaped that in operation the medium is compressed by centrifugal force to provide a void free, thermally conducting, medium between the base and the arm.

In accordance with another preferred feature the junction between each base and its support arm is such as to allow easy rotational movement of the base relative to the arm when at rest, but such as to produce close metal to metal contact by the effect of centrifugal force during rotation of the rotor in operation.

A preferred construction may be provided in which each base is mounted on its arm by a part of the arm extending into a bore in the base. Conveniently the high conductivity deformable medium may be vacuum grease.

In one particularly convenient arrangement, each base is mounted on its arm by the arm being screw threaded into the base, preferably there being provided high vacuum grease in the screw thread junction to provide good thermal contact between the arm and the base. This feature gives the advantage that although the base may be rotated about the arm to give adjustment of the angle of the base while the rotor is stationary or moving slowly, the effect of centrifugal force during the spinning of the disc during ion implantation, will be to lock up the screw threaded junction in operation. This prevents unwanted movement during scanning, and, more important, gives good, virtually metal to metal, thermal contact between the base and the arm to assist dissipation of heat from a target mounted on the base.

In a modification of this arrangement, the outer end of the arm is not threaded at all, but the support base is secured to the support arm by a thrust race. The outer surface of the end of the support arm in the bore in the base is a close sliding fit with the plain inner surface of the bore of the support base, and thermal contact is ensured by vacuum grease which is urged into contact with the surfaces by centrifugual force ensuring a void free interface medium.

In another convenient arrangement, each base is mounted on its arm by a part of the arm extending into a bore in the base, the arm having walls which, at the portion within the bore, are deformable, to a degree such that in operation the effect of centrifugal force on the coolant in the arm produces a high hydrostatic pressure which expands the deformable wall outwardly to produce good thermal contact between the arm and the base. Again, in accordance with this feature, rotation of the base on the arm is possible when the arm is stationary, but is prevented during spinning of the rotor for scanning purposes. Also, the expansion of the deformable wall produces good thermal contact between the arm and the base and allows dissipation of heat produced during ion implantation.

Turning now to the aspect of the invention concerned with loading and unloading of target elements, the apparatus may include a loading and/or unloading mechanism for loading and/or unloading target elements to and from the support bases, the mechanism comprising a moveable platform for supporting a target element, means moving the platform beween a first position in which a target element may be deposited on and/or removed from the platform by a feeding and/or collecting means, and a second position in which a target element may be lifted off and/or deposited on the platform by a support base of the rotor.

Conveniently the platform includes a transfer aperture through which a support base may be moved upwardly to remove from the platform a target element resting on the platform over the aperture, and through which a support base may be moved downwardly to deposit a target element on the platform.

Preferably the feeding and/or collecting means comprises means for presenting a cassette of target elements to the platform, and the platform includes a projecting portion for insertion into the cassette to remove a target element from, or deposit a target element into, the cassette.

In accordance with one feature, the mechanism includes an orientation member for supporting a target element and for rotating the element to a selected orientation before transfer to a support base, and in which the platform includes a transfer aperture through which the orientation member may be moved upwardly to remove from the platform a target element resting on the platform over the aperture, and through which the orientation member may move downwardly to deposit a target element on the platform.

In one arrangement, the apparatus includes drive means for effecting a loading sequence of movements in which: said platform moving means moves the platform to said first position; said feeding and/or collecting means deposits a target element on the platform; said platform moving means moves said platform to said second position; said orientation member moves upwardly lifts said target element from the platform, and rotates the target element to a selected orientation; said platform moving means moves said platform back to said first position; said orientation member deposits said target element on said platform by a downward movement; said platform moving means moves said platform back to said second position; and a support base lifts the target element from the platform by an upward movement produced by driven rotation of the rotor.

In accordance with another feature there may be provided a corresponding sequence for unloading. Thus the apparatus may include drive means for effecting a sequence of movements in which: said platform moving means moves said platform to said second position; a support base deposits a target element on the platform by a downward movement produced by driven rotation of the rotor; said platform moving means moves said platform to said first position; said orientation member moves upwardly and lifts said target element from the platform; said platform moving means moves said platform back to said second position; said orientation member deposits said target element on said platform by a downward movement; said platform moving means moves said platform to said first position; and the said feeding and/or selecting means lifts the target element off the platform.

It is preferred that throughout operation of the apparatus, the axis of rotation of the support rotor is horizontal or approximately horizontal. It is preferred that during ion implantation the orientation of each support base is vertical at the implant position, but that during loading and unloading, the orientation of each support base is horizontal or approximately horizontal.

It is to be appreciated that features of the invention which have been set out with regard to apparatus, may also be provided with regard to a method according to the invention, and vice versa.

In particular, there is provided in accordance with the invention, a method of implanting ions in a target element, including the steps of directing an ion beam onto a target region, arranging a plurality of target elements on support bases distributed around a support rotor with the target elements lying in planes transverse to the axis of rotation of the rotor, rotating each support base about an axis which is transverse to the axis of rotation of the rotor to provide adjustment of the implant angle for ion implantation, and rotating the support rotor so as to carry the target elements through the target region to produce scanning of the ion beam across the target elements.

In accordance with another aspect of the present invention, there is provided a method of loading target elements onto a support rotor for rotating the element through an ion beam during ion implantation, the method comprising rotating a support rotor having a plurality of support bases mounted on and distributed around the support rotor, loading a target element onto a support base which is orientated so as to lie in a plane containing the axis of rotation of the rotor, or approximately in such a plane, rotating the support base until the support base lies in a plane transverse to the axis of rotation of the rotor, directing an ion beam onto a target region, and rotating the support rotor so as to carry the bases through the target region to produce in operation scanning of an ion beam across the bases.

Turning now to the aspect of the invention which is concerned with heat transfer, there is provided in accordance with the invention a heat sink for an element to be operated on in an operation involving rotary movement of the element, the heat sink comprising a body of material for conducting heat away from the element, and a component adapted to be positioned between the body and the element and being responsive to centrifugal force to produce or enhance thermal contact between the element and the body.

In one convenient form, the said component comprises a sheet of material fixed to the said body and having a multiplicity of moveable projections extending away from the body for making thermal contact with the said element, the moveable projections being such as to be moveable in operation away from the body towards the element in response to centrifugal force.

In a yet further aspect of the invention, there may be provided a heat sink which is not dependent upon centrifugal effect. In such an arrangement, there may be provided in accordance with the invention, a heat sink comprising a body of material for conducting heat away from an element in operation, characterised by a component for providing thermal contact between the element and the body, the component having a multiplicity of moveable projections extending outwardly from the body and moveable towards and away from the body, the projections being biased away from the body. For example there may be provided a sheet of material for providing thermal contact with the body, one side of the sheet being secured to the body, and the sheet having a multiplicity of flaps inclined outwardly away from the body, the flaps being compressible towards, and resiliently biased away from, the body, independently of centrifugal force.

However, in a particularly preferred combination, there is provided a heat sink for an element to be operated on in an operation involving rotary movement of the element, the heat sink comprising a body of material for conducting heat away from an element during an operation involving rotary movement of the body and the element, a sheet of material for providing thermal contact between the element and the body, the sheet having one side secured to the body and having a multiplicity of flaps inclined outwardly away from the body for making thermal contact with the said element, the flaps being positioned in such a manner relative to the axis of rotation of the body during the said rotary movement, that centrifugal force acts to urge the flaps outwardly from the sheet during operation.

In a preferred construction, each flap is constituted by an area of the sheet which has been partially separated from the remainder of the sheet, and is bent away from the remainder of the sheet. Preferably each flap is constituted by a partially separated area of the sheet which has been bent from the remainder of the sheet through an angle greater than 90°. Most preferably each flap is of rectangular shape, and is formed from an area of the sheet which has been separated from the remainder of the sheet along three sides of a rectangle, and has been bent away from the remainder of the sheet along the fourth unseparated side of the rectangle.

Conveniently each sheet is formed of metal of high thermal conductivity, for example aluminum, such as aluminum baking foil. Conveniently the sheet is secured to the body by adhesive or by braze contact.

In practice, a very large multiplicity of such flaps may be easily produced for example by stamping the flaps out of a plain sheet of aluminum. The flaps may for example by of diameter 1 mm by 1 mm, and may be closely spaced across the sheet. Thus excellent thermal contact is made between the sheet fastened to the heat sink, and the target element to be placed against the perforated sheet.

In another construction, flaps are formed by folding a sheet of material concertina fashion.

Embodiments of the invention will now be described by way of example with reference to the accompanying drawings in which:

FIGS. 3A and 3B are, respectively, side and end view of a heat sink support base, forming part of the target presentation apparatus of FIGS. 2A and 2B;

FIGS. 5A and 5B show, respectively, plan and side views of a loading and unloading mechanism for loading and unloading target elements onto support bases;

FIGS. 8A and 8B show side views of an alternative device for providing thermal contact between a target element and a heat sink support base embodying the invention, the figures showing the device in an unloaded, and loaded, condition, respectively, and the figures corresponding generally to FIGS. 6A and 6B.

Figure 1:
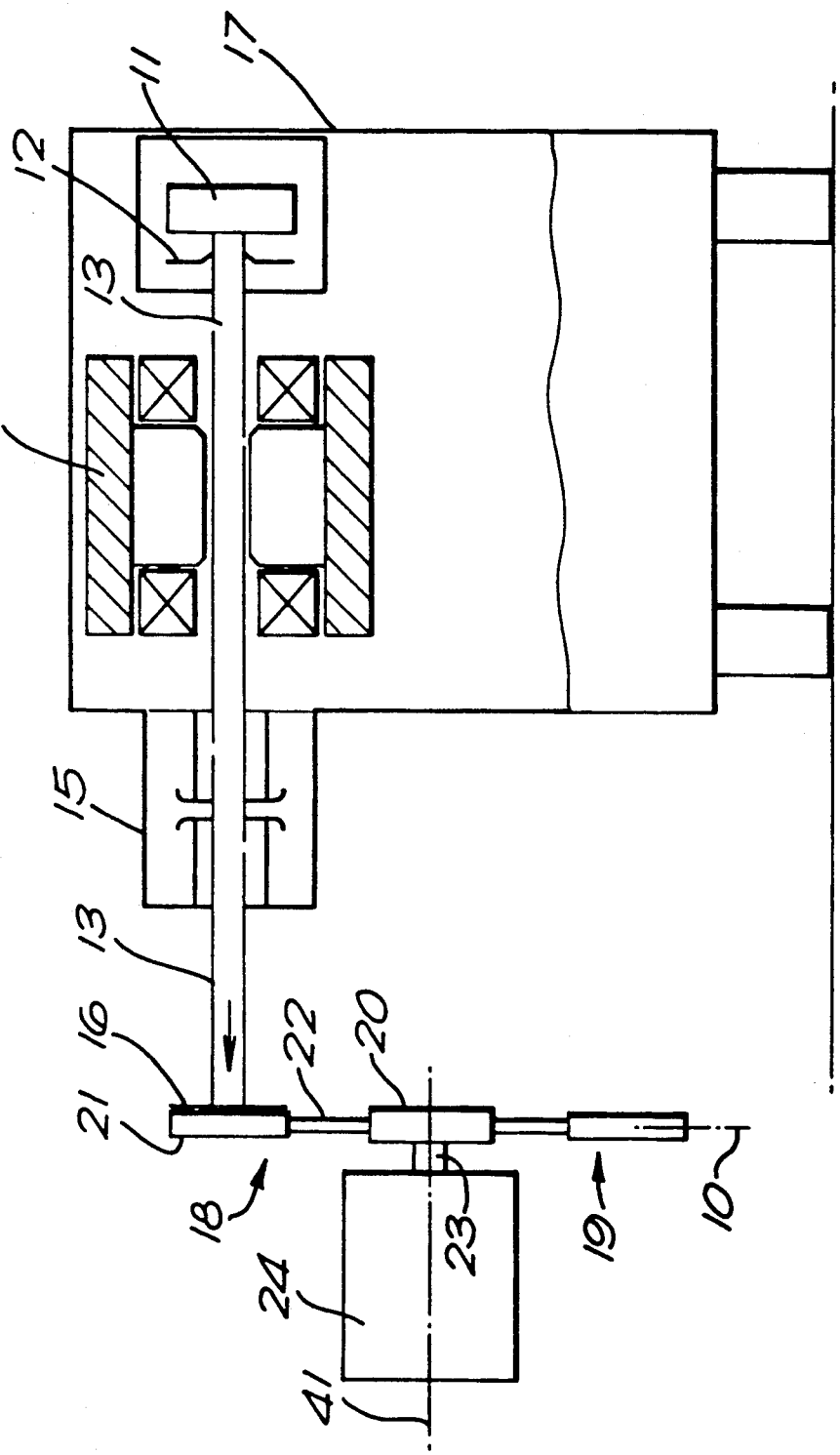
FIG. 1 is a diagrammatic side view of ion implantation apparatus embodying the invention.

Referring to FIG. 1, an ion implantation apparatus comprises an ion source 11 and an extraction electrode 12 for producing an ion beam 13. An analysing magnet 14 isolates the species required to be implanted, and the ion beam passes through a post-analysis acceleration system 15 before being directed onto a target element 16. The ion source, extraction electrode, and anlysing magnet, are housed in a high voltage terminal indicated generally at 17.

Figure 2A:
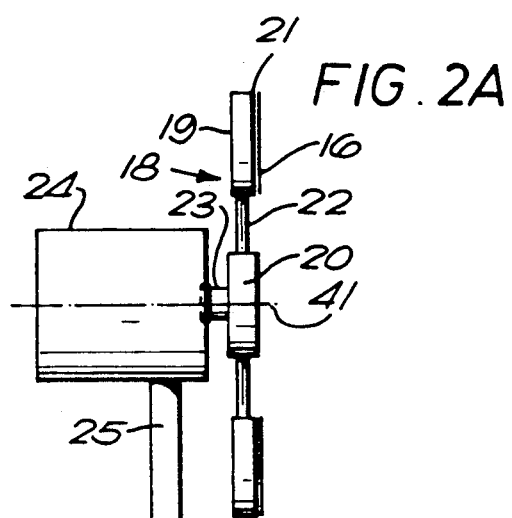
FIGS. 2A and 2B are, respectively, side and end views of target presenting apparatus embodying the invention, and as shown in FIG. 1.

The target element 16 is typically a semi-conductor wafer for example a 200 mm diameter circular wafer of silicon of thickness 0.75 mm. The target element is one of a plurality of target elements presented to the ion beam by a target presentation apparatus indicated generally at 18, and shown in more detail in FIG. 2A and 2B.

The target presentation apparatus 18 comprises a support rotor 19 comprising a central core structure or hub 20, and ten support bases 21 arranged in a circular configuration around the hub 20, each support base 21 being mounted on a radial support arm 22. The wheel 19 is mounted for rotation on an axle 23 and rotated about an axis 41 by a spin motor 24, which in turn is mounted on a shaft 25. In other arrangements, the ten 200 mm diameter heat sinks may be replaced by for example thirteen 150 mm diameter, or seventeen 125 mm diameter, or twenty 100 mm diameter heat sinks.

Each support base 21 consists of a cylindrical disc of material of a high thermal conductivity, such as aluminum and acts as a heat sink for the target element 16 during ion implantation. Passageways for coolant pass to and from the region of the heat sink support base 21 along the arm 22 and through the hub 20 and axle 23 and out of the apparatus along the shaft 25, as will be described further hereinafter. The wheel 19 is housed in a evacuated housing 26. A seal 27 is provided between the shaft 25 and the vacuum housing 26, to allow movement of the shaft 25 along its length.

In normal operation, the target elements 16 are presented to the ion beam 13 perpendicular thereto, or at a selected angle as will be described hereinafter, and the wheel 19 is rotated at high velocity, for example 600 to 1200 rpm by the motor 24. This produces scanning of the ion beam across the target elements in a direction substantially perpendicular to the axis of each arm 22. In addition, the shaft 25 is subjected to slow speed reciprocal motion along its length (that is to say upward and downward motion in FIGS. 2A and 2B). Together, the rotation of the wheel, and the reciprocating motion of the shaft 25, produce scanning of the ion beam across the surface of each target 16.

There will now be described in more detail, with reference to FIGS. 3A and 3B, one form of the heat sink support base 21. Each heat sink support base 21 is formed from a solid cylindrical block 28. The block 28 has a screw threaded bore 29 aligned along a diameter of the block 28, terminating in a vent passage 30 which leads back to the outer circumference of the block 28. The support arm 22 has a corresponding threaded end 31, and the screw thread junction between the two is lubricated by and filled with a vacuum grease. This allows rotation of the support base 21 about the arm 22 when the wheel is stationary or moving slowly, but provides a good thermal contact between the heat sink 21 and the arm 22 during high speed rotation of the wheel 19. During this rotation considerable centrifugal forces act on the heat sink 21 (amounting to forces of the order of 500 G) which give greatly improved, virtually metal to metal, contact. Throughout the screw thread, very good contact is made by the outer side of each thread on the block 28, with the inner side of each thread on the arm 22, with an extremely thin layer of grease across the interface to ensure contact. Cooling is carried out by coolant 33 being pumped outwardly along the arm 22 along a passageway 34, and being returned along a passageway 35, the passageways 34 and 35 being coaxial along the arm. Within the hub structure 20, corresponding coolant passageways 36 and 37 are provided.

A further sleeve 38 is shown in FIGS. 3A and 3B, surrounding and forming part of the arm 22. This sleeve 38 is keyed to the heat sink 21 at its outer end, and at its inner end has a ring gear 39 mating with a rotary drive means indicated diagrammatically at 40. The purpose of this drive 40 is to produce rotary movement of the heat sink 21 about an axis 10 of the support arm 22. A first movement is a fine adjustment of, for example, plus or minus 7° on either side of a plane perpendicular to the axis of rotation of the wheel 19. This adjustment is provided to allow adjustment of the implant angle by the ion beam 13. A second movement provided by the drive means 40 comprises a rotation of the heat sink support base 21 through 90°, to an orientation in which the plane of the heat sink 21 contains the axis of rotation 41 of the rotor 19. The purpose of this orientation is for loading and unloading as will be described hereinafter. A wide variety of arrangements for rotation of the heat sink 21 can be provided in the hub structure 20, including centrifugally driven arrangements.

There may be provided in accordance with the invention an alternative arrangement of fastening the heat sink 21 to the arm 22, to provide good thermal contact, yet allowing rotation of the heat sink 21. In this alternative arrangement (not shown), the outer end 31 of the arm 22 may be threaded for only a short portion at the entrance to the heat sink 21, or a thrust race may be provided close to the hub. This is followed by a smooth cylindrical surface with is a close rotational fit with a smooth bore in the block 28. Again the interface may be filled with vacuum grease but this is not essential. The wall of the end 31 of the arm 22 is in this case arranged to be a thin wall, between the passage 34, and the block 28, and is arranged to be deformable under the substantial hydrostatic pressure which builds up in the coolant 33 during high speed rotation of the heat sink 21. The inner wall 31 expands elastically under the influence of the high hydrostatic pressure, converting the easy sliding and rotation fit which is available when stationary, into intimate contact during high speed rotation.

In another alternative (also not shown), the outer end 31 of the arm 22 is not threaded at all, but the support base 21 is secured to the support arm 22 by a thrust race. The outer surface of the end 31 of the support arm 22 is a close sliding fit with the plain inner surface of the bore 29 of the support base 21, and all the surfaces are rigid and non-deformable with centrifugal force. Thermal contact is ensured by vacuum grease which is urged into contact with the surfaces by centrifugal force ensuring a void free interface medium. This allows rotation while spinning.

Figure 2B:
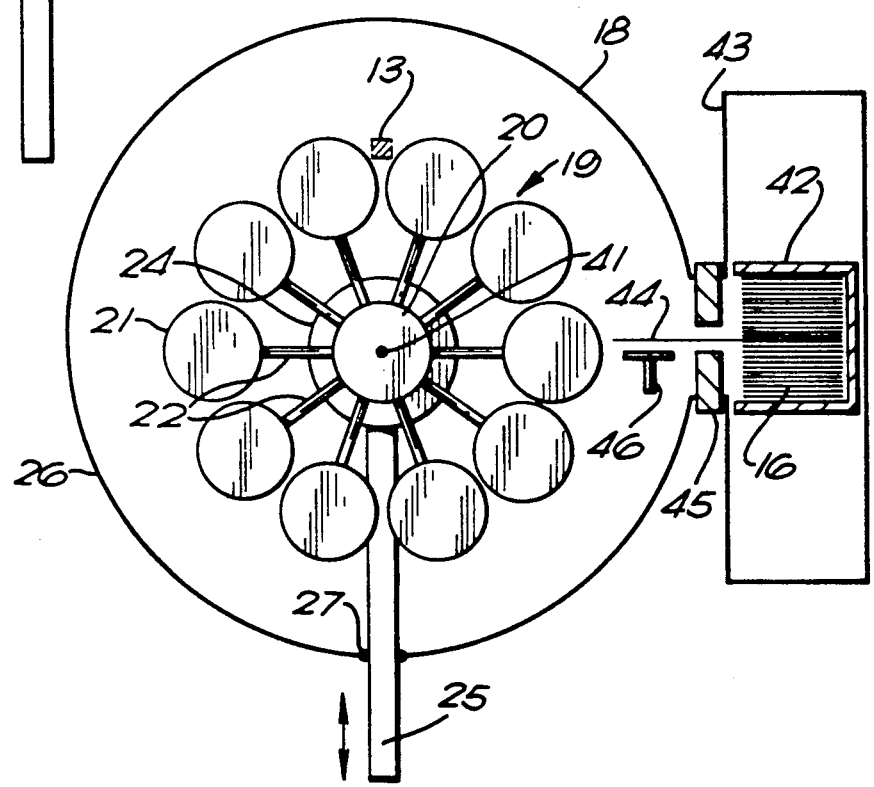

There will now be described with reference to FIGS. 4A, 4B, 5A and 5B, apparatus for, and a method of, loading and unloading target element wafers onto and from the wheel 19 of the target presenting apparatus. In normal ion implantation operation, the wheel 19 of FIGS. 1 to 2B is kept in a vertical, or approximately vertical plane, and the heat sinks 21 are kept substantially vertical, with variations from the verticality of the wheel 19 and heat sinks 21, chosen for particular implant requirements. For loading and unloading however, the heat sinks 21 are rotated through 90° so that they can be brought into a horizontal position in the 3 o'clock and 9 o'clock positions of the wheel. Target wafers can be loaded and unloaded in one or both of these positions.

Figure 4A:
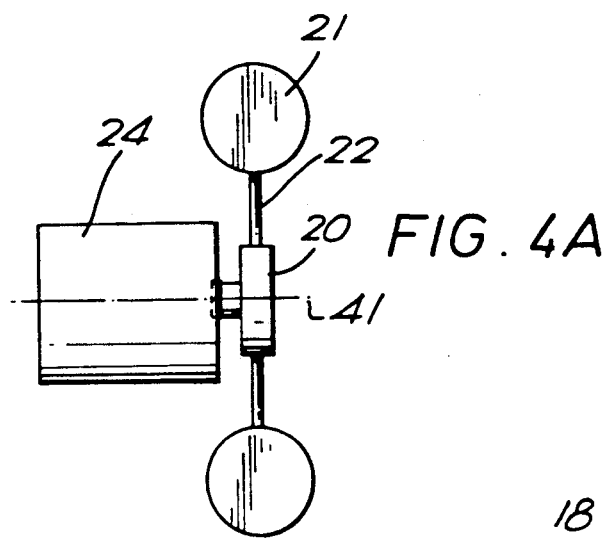
FIGS. 4A and 4B are, respectively, diagrammatic side and end views of the apparatus shown in FIGS. 2A and 2B, but with the heat sink support bases rotated through 90° on supporting arms thereon, to present the support bases in a load/unload position.
Figure 4B:
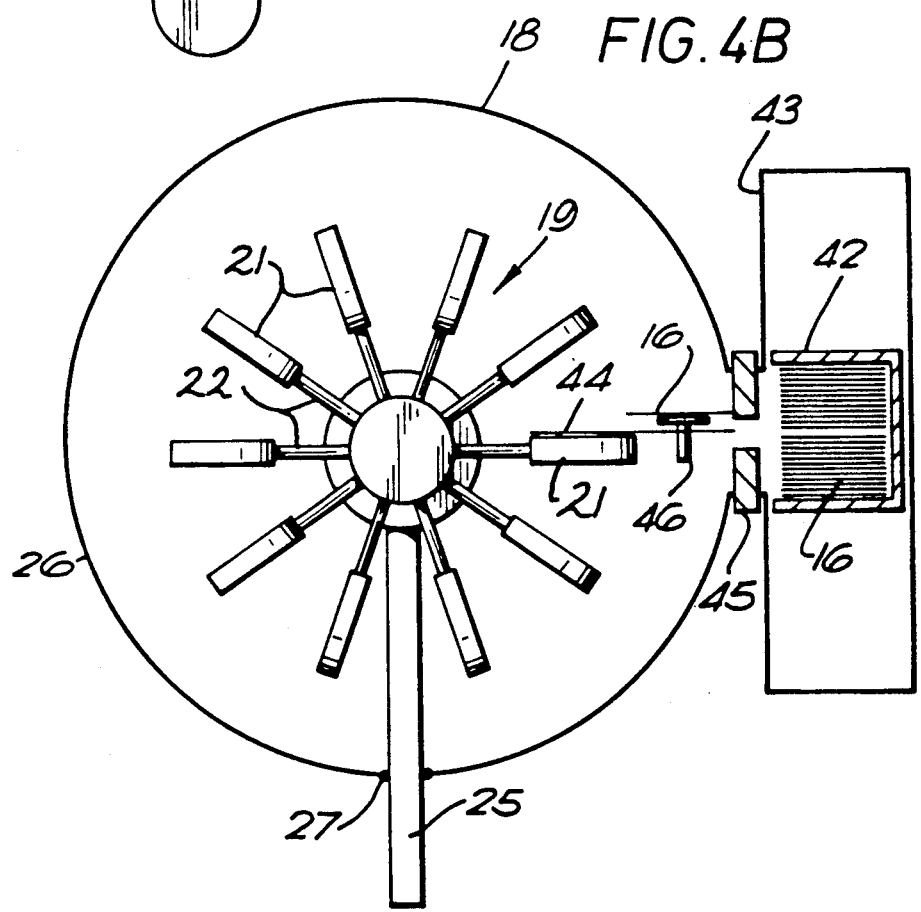

Referring to FIG. 4B, twenty-five target wafers 16 are stacked vertically in a cassette 42 mounted in a load lock 43. Means are provided (not shown) for giving a vertical indexing movement of the cassette 42 to bring a selected target wafer 16 into alignment with a horizontally moveable platform 44 positioned inside the vacuum chamber 18, opposite a letter box gate valve 45 positioned between the vacuum chamber 18 and the load lock 43. The platform 44 is in the form of a thin flat blade, shown in more detail in FIG. 5A and 5B. Also shown in FIG. 4B is an orientation member 46, consisting of a pedestal having a vertical support shaft 47 and a horizontal portion 48.

As shown in FIGS. 5A and 5B, the blade 44 has a left hand portion defining an aperture 49 between parallel sides 50, and a narrower projecting portion 51 defining an aperture 52. The pedestal 48 is able to pass through both apertures 49 and 52. The blade 44 is moveable between a first position indicated in full lines in FIGS. 5A and 5B, in which the blade 44 is moved towards the right, and a second position shown in dotted lines in FIG. 5A in which the blade 44 is moved toward the left. When the blade is in the first position, towards the right, the projecting portion 51 of the blade 44 extends into the cassette 42, and the pedestal 48 is able to move upwardly and downwardly through the aperture 49 between the sides 50. When the blade 44 is in the second position, to the left in FIG. 4A, the projecting portion 51 of the blade is withdrawn from the cassette, and the sides 50 are in register with the heat sinks 21 of the wheel 19. In this leftward position, the pedestal 48 is able to move upwardly and downwardly through the aperture 52, and the heat sinks 21 are able to rotate through the aperture 49 of the blade 44, between the sides 50.

Extending inwardly from the sides 50 of the blade 44 are 4 wafer support fingers 53. Corresponding notches 54 are provided in each heat sink 21, allowing the heat sinks 21 to be rotated through the aperture 49 without contacting the support fingers 53.

The operation of loading and unloading cassettes is as follows. The blade 44 passes through the letter box gate valve 45 to a position under a target wafer 16 to be loaded. The cassette 42 is indexed downwards to leave the target wafer 16 on the projecting portion 51 of the blade 44. At this time the blade is in the first position.

The blade 44 then moves horizontally back through the letter box gate valve to the second position, and stops with the target wafer 16 over the orientation pedestal 46. The pedestal 46 passes upwardly through the aperture 51 and lifts the target wafer 16 off the blade 44. The target wafer is then rotated for orientation detection, and then rotated to the required position. While this is happening the blade 44 returns to the first position with the projecting portion 51 extending into the cassette 42. The cassette 42 is indexed downwardly to the next position to deposit a further target wafer on the platform 44. At the same time the pedestal 46 is lowered to deposit the oriented wafer onto the wafer support fingers 53 of the blade 44.

The blade 44 is then moved back through the gate valve to the second position to the left in FIG. 5A. The first selected target wafer 16 is now in a loading position in correlation with the rotating heat sinks 21, while the second mentioned target wafer is positioned above the orientation pedestal 47. The wheel 19 is indexed slowly in rotation to bring a heat sink 21 upwardly through the aperture 49 to pick a wafer 16 off the blade 44. At the same time the orientation pedestal 47 lifts a second target wafer from the blade 44, and the cycle is repeated to continue orienting and loading wafers.

Wafers are unloaded by reversing the steps set out above, except that the orientation step can be omitted. In FIG. 4B a single loading and unloading arrangement is provided, but if required loading and unloading can be effected at two stations, placed at the 3 o'clock and 9 o'clock positions of the wheel 19.

In some methods of ion implantation it may be necessary to reorient the wafer between different stages of implanting. It can be done by unloading a wafer onto the blade, and lifting and reorienting the wafer by the pedestal 46, and returning the wafer to the heat sink, without the need to take the wafer back out of the vacuum chamber into the cassette.

A number of advantages arise from the method of loading and unloading described. Horizonal loading is preferred because of the use of gravity which simplifies equipment. During ion implantation, a vertical position of the wafers is preferred for reasons of cleanliness. In previous machines it has been necessary to move the entire scanning wheel to a horizontal position, if horizontal loading is required. The present arrangement allows a simple rotation of the heat sink from the vertical to the horizontal position for loading purposes.

Unlike known systems precise indexing of the wheel is not required; it can be loaded without stopping the wheel rotation provided that this is slow. The final wafer to heat sink motion does not need to be provided by the wafer handling mechanism.

Figure 6A:
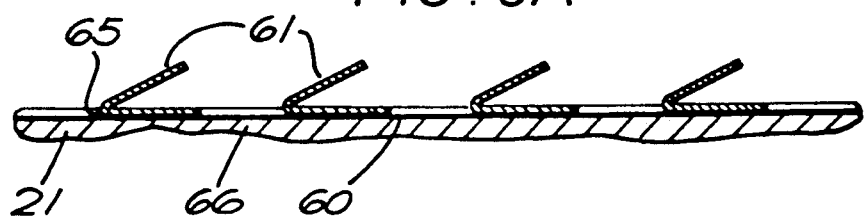
FIGS. 6A and 6B show side views of a device for providing thermal contact between a target element and a heat sink support base embodying the invention, the Figures showing the device in an unloaded, and loaded, condition, respectively.
Figure 6B:
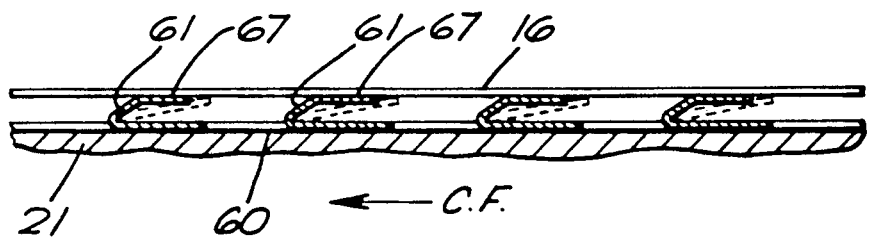
Figure 7:
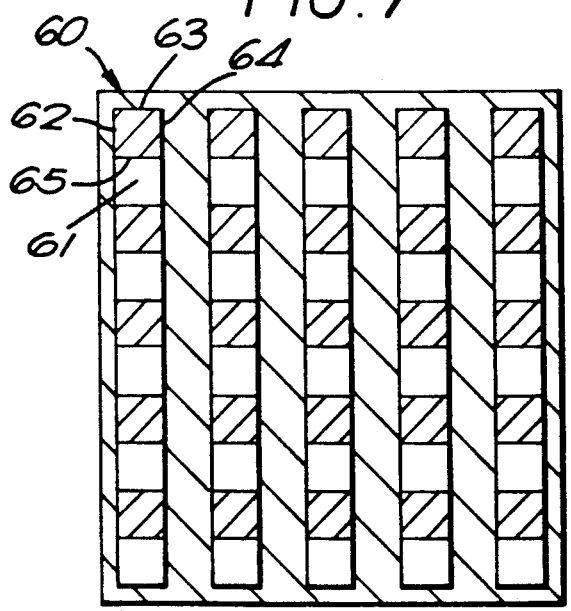
FIG. 7 is a diagrammatic plan view of the thermal contact device of FIGS. 6A and 6B.

There will now be described a final aspect of the invention, concerned with improved heat transfer arrangements. Although it is possible to utilise features of the invention which have been described in embodiments so far, with conventional centrifugal clamping of the wafer onto a heat sink, the mechanism described so far are particularly suitable for use where the target wafers are maintained in good thermal contact with the heat sink without the need for centrifugal clamping which can lead to implant angle errors under certain circumstances. One particularly advantageous way of achieving this will now be described with reference to FIGS. 6A, 6B and 7. A device for providing thermal contact between two bodies, for example between a heat sink 21 described in the previous text, and a target wafer 16, is shown in FIGS. 6A, 6B and 7. A sheet of aluminium 60 has stamped from it a series of flaps 61, each produced by cutting three sides of 62, 63 and 64 of a rectangle. The flap 61 then remains attached to the sheet 60 by the fourth side 65 of the rectangle, which forms a hinge between the sheet 60 and the flap 61. In the stamping process, the flap 61 is pushed outwardly from the sheet, and in a further step, the flap 61 is then bent through an angle of more than 90°, to assume the folded position shown in FIG. 6A. The final step of bending the flap 61 can be achieved for example by an air blast.

By way of example, the aluminum sheet may have a thickness of 0.05 mm, and each rectangular flap 61 may be a square of side 1 mm. The spacing of the flaps may be, as shown in FIG. 7, equal to the dimensions of the flaps.

In FIG. 6A, the sheet 60 is shown secured by adhesive or braze 66 to a heat sink 21. In FIG. 6B the same arrangement is shown, but with a target wafer 16 positioned on top of the heat sink 21, and lightly clamped thereto, by clamps not shown. The position of the flap 61 is shown in dotted lines, when the sandwich is at rest. When the wheel 19 is rotated at high speed, the effect of centrifugal force on the flaps 61 bends the flaps to the position shown in full lines in FIG. 6B. As can be seen, the effect of this is to provide a large multiplicity of substantial contact areas 67 in which the flap 61 is forced into intimate contact with the wafer 16. This produces excellent thermal contact between the wafer 16 and the heat sink 21.

The orientation of the flaps is chosen so that centrifugal force acting on the flaps tends to lift the flaps. The spacing between the wafer and the heat sink, and the thickness of the foil and the rotation speed of the disc are chosen so as not to allow the flaps to overbend. By way of example, with dimension illustrated, over 7000 contacts can be achieved on a 200 mm diameter wafer.

In FIGS. 8A and 8B there is shown an alternative form of device for providing thermal contact between a target element and a heat sink support base embodying the invention. FIGS. 8A and 8B correspond generally to FIGS. 6A and 6B, and show the device in an unloaded, and loaded, condition respectively. The device again consists of a sheet 60 of aluminium foil, but in this embodiment the foil is folded in a concertina arrangement, and is not cut to provide the flaps. In the unloaded position shown in FIG. 8A, the sheet 60 provides projections 61 by virtue of the folding of the sheet. The sheet 60 is secured at line contacts 70 to the body 66 by braze contact. When loaded as shown in FIG. 8B, the projections 61 are pressed sideways to form flaps as shown, by the effect of the target wafer 16. After the projections 61 have been deformed as shown in FIG. 8B, the projections behave as flaps and operate in the same manner as has been described with reference to 6b, the thermal contact being made at the contact areas 67.

In some circumstances the thermal contact device shown in FIGS. 6A, 6B, 7, 8A and 8B, may be used without centrifugal force, if spring metal foil is used.

I claim:

1. A heat sink for an element to be operated on in an operation involving rotary movement of the element, the heat sink comprising:
    a body formed of material that conducts heat away from the element in operation; and
    a component disposed in contact with the body for providing thermal contact between the element and the body;
    said component being fixed to said body and including a plurality of moveable projections extending away from the body for making thermal contact with said element, the moveable projections being moveable in operation away from the body towards the element in response to centrifugal force.

2. A heat sink according to claim 1, wherein said component comprises a plurality of flaps inclined outwardly away from the body for making thermal contact with the element, said moveable projections comprising said flaps, the flaps being positioned in such a manner relative to an axis of rotation of the body during the rotary movement that centrifugal force urges the flaps outwardly from the body during operation.

3. A heat sink according to claim 2, wherein said component comprises a sheet of material fixed to the body, each flap comprising an area of the sheet that has been partially separated from a remainder of the sheet, the area being bent away from the remainder of the sheet.

4. A heat sink according to claim 3, wherein each flap includes a partially separated area of the sheet which has been bent away from the remainder of the sheet through an angle greater than 90°.

5. A heat sink according to claim 3, wherein each flap as a rectangular shape, and is formed from an area of the sheet which has been separated from the remainder of the sheet along three sides of the rectangular shape, and has been bent away from the remainder of the sheet along a fourth unseparated side of the rectangular shape.

6. A heat sink according to claim 1, wherein said component comprises a sheet of material folded in a concertina fashion for providing said plurality of moveable projections.

7. A heat sink according to claim 1, wherein said component is formed of a metal having a high thermal conductivity.

8. A heat sink according to claim 7, wherein said component is formed of aluminum foil.

9. A heat sink according to claim 7, wherein said component is secured to the body by an adhesive.

10. A heat sink according to claim 7, wherein said component is secured to the body by a braze contact.

11. Apparatus for presenting target elements to an ion beam for ion implantation, comprising:
a support rotor having a plurality of support bases for supporting target elements, the support bases being mounted on and distributed around the support rotor; and
means for rotating the support rotor through an ion beam for scanning the ion beam across the target elements;
wherein each support base includes a body of material for conducting heat away from the target element being scanned, and a component for producing thermal contact between the target element and the body, said component comprising a plurality of moveable projections extending away from the body for making thermal contact with said element being scanned, the moveable projections being moveable away from the body towards the target element in response to centrifugal force produced by rotation of the support rotor during scanning of the ion beam across the target elements.

12. Apparatus for presenting target elements to an ion beam for ion implantation comprising:
a support rotor having a plurality of support bases, for supporting target elements, the support bases being mounted on and distributed around the support rotor;
main rotation means for rotating the support rotor about a main rotation axis through an ion beam for scanning the ion beam across the target elements; and
second rotation means for rotating each support base relative to the support rotor for orientation purposes, by rotation about a second axis that is transverse to the main rotation axis of the support rotor and which is directed generally towards the main rotation axis.

13. Apparatus according to claim 12, wherein said second rotation means provides a fine adjustment of an angle of the support base relative to a plane perpendicular to the main rotation axis of the support rotor, for adjusting an implant angle during ion implantation.

14. Apparatus according to claim 12, wherein said second rotation means allows rotation of the support base to lie substantially in a plane containing the main axis of rotation of the support rotor, for loading and unloading of target elements to and from the support base.

15. Apparatus according to claim 12, wherein the support rotor includes a central core structure and a plurality of support arms, each of said support arms extending outwardly from the central core structure, each support base being rotatably mounted on one of the support arms for rotation about said second axis which lies substantially in the direction of the support arm.

16. Apparatus for presenting target elements to an ion beam for ion implantation, comprising:
a support rotor having a plurality of support bases for supporting target elements, the support bases being mounted on and distributed around the support rotor, the support rotor including a central core structure and a plurality of support arms, each support arm extending outwardly from the core structure, each support base being rotatably mounted on one of the support arms;
first rotation means for rotating the support rotor about a first rotation axis through the ion beam for scanning the ion beam across the target elements; and
second rotation means for rotating each support base relative to the support rotor about a second axis transverse to the first rotation axis and directed generally towards the first axis, said second rotation means providing fine adjustment of an angle of the support base relative to a plane perpendicular to the first axis of rotation of the support rotor, and adjusting an implant angle during ion implantation, for providing rotation of the support base through approximately 90°, and for loading and unloading target elements to and from each of the support bases.

17. Apparatus according to claim 16, wherein said second axis of rotation passes through the first rotation axis.

18. Apparatus according to claim 17, wherein said second axis of rotation is radial or substantially radial to the first rotation axis.

19. Apparatus according to claim 17, wherein said second axis of rotation is inclined to a plane perpendicular to the first axis of rotation.

20. Apparatus according to claim 16, further comprising a junction between each base and its respective support arm, the junction including a thermally conducting, deformable medium, said junction being shaped so that the medium is compressed by centrifugal force, thereby providing a void free, thermally conducting, medium between the base and tne arm.

21. Apparatus according to claim 16, further comprising a junction disposed between each base and its respective support arm, said junction allowing easy rotational movement of the base relative to the arm when the apparatus is at rest, and producing close contact by the effect of centrifugal force during rotation of the rotor when the apparatus is in operation.

22. Apparatus according to claim 21, wherein each support base is mounted on its respective arm by being screw threaded thereto.

23. Apparatus according to claim 16, further comprising a loading/unloading mechanism for loading/unloading target elements to and from the support bases, the loading/unloading mechanism comprising a moveable platform for supporting the target element, and means for moving the platform between a first position in which the target element may be deposited and removed from the platform by one of a feeding and collecting means, and a second position in which the target element may be lifted off and deposited on the platform by the support base of the rotor.

24. Apparatus according to claim 23, wherein the loading/unloading mechanism includes an orientation member for supporting one of the target elements and for rotating the element to a selected orientation before transferring the element to a support base, and wherein the moveable platform includes a transfer aperture through which the orientation member may be moved upwardly to remove the target element from the platform, the target member being disposed above said transfer aperture, and the orientation member being able to move downwardly through said transfer aperture to deposit a target element on the platform.

25. A method of implanting ions in a target element, including the steps of:

directing an ion beam onto a target region;

arranging a plurality of target elements on support bases distributed around a support rotor with the target elements lying in planes transverse to the axis of rotation of the rotor;

rotating the support rotor so as to carry the target elements through the target region to produce scanning of the ion beam across the target elements; and adjusting the implant angle for ion implantation by rotating each support base relative to the overall support rotor about an axis which is transverse to the main axis of rotation of the rotor and which is directed towards that main axis of rotation of the rotor.

26. A method of implanting ions in a target element, including the steps of:

directing an ion beam onto a target region;

arranging a plurality of target elements on support bases distributed around a support rotor with the target elements lying in planes transverse to the axis of rotation of the rotor;

rotating the support rotor so as to carry the target elements through the target region to produce scanning of the ion beam across the target elements; and adjusting the orientation of each support base for loading and unloading purposes, by rotating the support base relative to the overall support rotor by approximately 90°.

* * * * *